United States Patent
Tsai

(10) Patent No.: US 7,235,426 B2
(45) Date of Patent: Jun. 26, 2007

(54) METHOD OF BACKSIDE GRINDING A BUMPED WAFER

(75) Inventor: Yu-Pen Tsai, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 293 days.

(21) Appl. No.: 11/019,383

(22) Filed: Dec. 23, 2004

(65) Prior Publication Data

US 2005/0142696 A1   Jun. 30, 2005

(30) Foreign Application Priority Data

Dec. 26, 2003 (TW) .............................. 92137202 A

(51) Int. Cl.
*H01L 21/00* (2006.01)
(52) U.S. Cl. .................... 438/113; 438/114; 438/613; 257/E21.499
(58) Field of Classification Search ............... 438/106, 438/110, 113, 114, 613; 257/E21.499, E21.508
See application file for complete search history.

(56) References Cited

U.S. PATENT DOCUMENTS 6,656,819 B1 * 12/2003 Sugino et al. ............. 438/460
6,794,751 B2 * 9/2004 Kumamoto ................ 257/738
2002/0166625 A1 11/2002 Ball et al.
2003/0001283 A1 1/2003 Takashi et al.

FOREIGN PATENT DOCUMENTS

TW         516116        1/2003

* cited by examiner

*Primary Examiner*—Brook Kebede
(74) *Attorney, Agent, or Firm*—Bacon & Thomas, PLLC

(57) ABSTRACT

A method for backside grinding a bumped wafer is disclosed. A wafer has a plurality of bumps formed on the active surface thereof. Prior to grinding the back surface of the wafer, a hot-melt adhesive layer is formed on the active surface of the wafer so as to be adhered to the active surface and cover the bumps. Also a grinding film is attached to the hot-melt adhesive layer. After grinding the back surface of the wafer, the grinding film is removed but the hot-melt adhesive layer is remained on the wafer for the following wafer-dicing step.

25 Claims, 7 Drawing Sheets

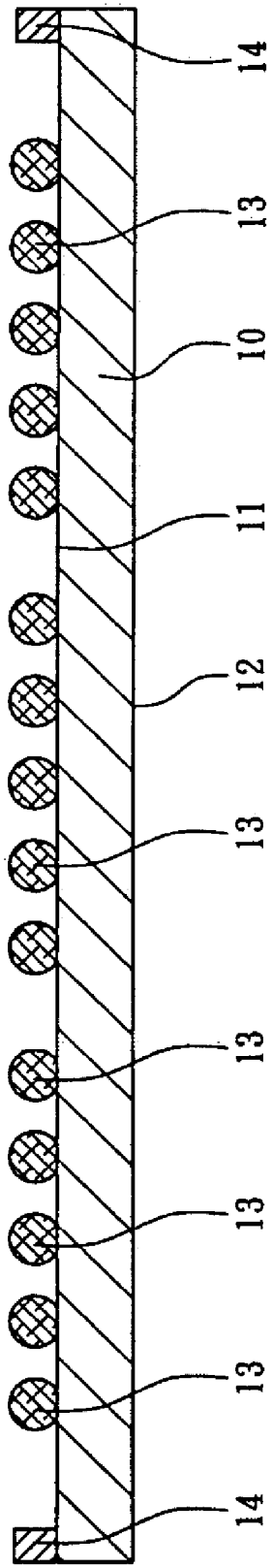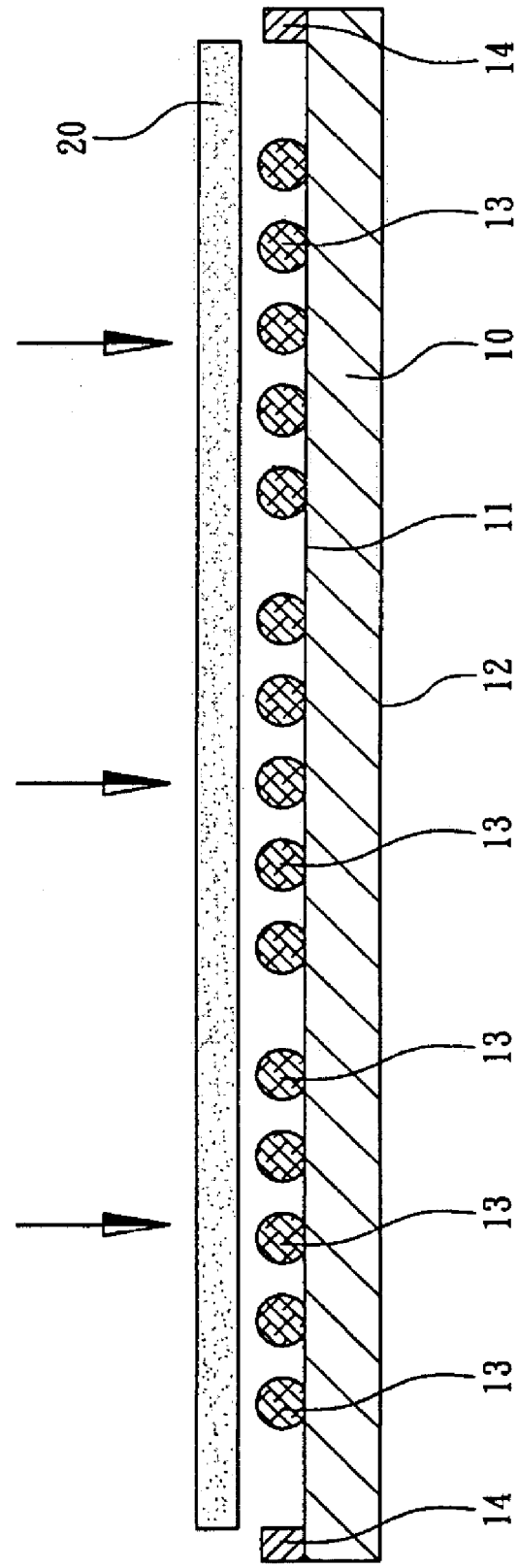

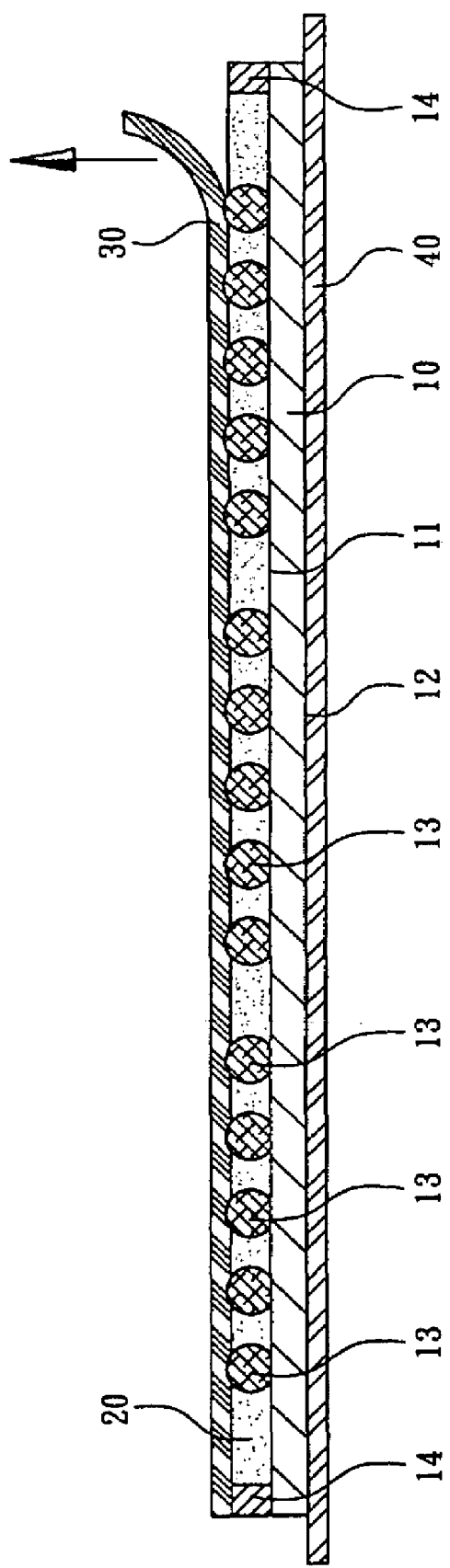
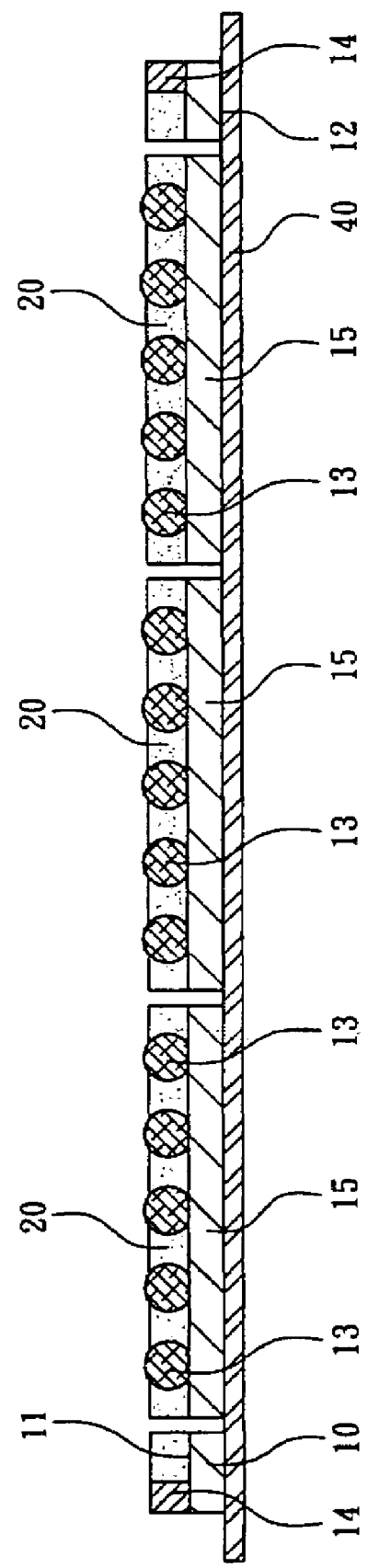
FIG. 2G
FIG. 2H

METHOD OF BACKSIDE GRINDING A BUMPED WAFER

BACKGROUND OF THE INVENTION

1. Field of Invention

This invention relates to a method of backside grinding a bumped wafer. More particularly, the present invention is related to a method of backside grinding a bumped wafer for protecting the devices and the bumps formed on the active surface of the wafer from being damaged at the duration of processing.

2. Related Art

In this information explosion age, integrated circuits products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuits package. Moreover, compared with a wire-bonding package or a tape automated bonding (TAB) package, a flip-chip package uses a shorter electrical path on average and has a better overall electrical performance. In a flip-chip package, the bonding pads on a chip and the contacts on a substrate are connected together through a plurality of bumps formed on the chip by a conventional bumping process and then an underfill material is filled into the gap between the chip and the substrate to encapsulate the bumps so as to well protect the bumps. In such a manner, the reliability of such flip chip package is enhanced.

As mentioned above, in order to have a thinner package, the step of backside grinding a wafer in a package process is necessary before the wafer is diced into a plurality of chips. Therefore, before the wafer is diced, the active surface of the wafer is placed on a grinding film, and then the back surface of the wafer is thinned under a backside grinding process. However, usually, there are electronic devices formed on the active surface of the wafer, such as bumps, passive components, and metal posts, and are protruded from the active surface of the wafer without appropriate protection, so the electronic devices are easily fell away from the wafer at the duration of removing the grinding film from the wafer.

In order to well protect the electronic devices, there is a backside grinding method for a wafer level packaging disclosed in TW Pat. 516116, which utilizes an organic layer formed on a surface of a bumped wafer and a UV film (ultraviolet film) attached to the organic layer, regarded as a grinding film, to protect the bumps of the wafer at the processing steps. Therein, the organic layer is usually made of a material selected from Benzotriazoles and substituted Benzotriazoles as well known organic solderability preservatives (OSP). Usually, the organic layer is easily fell off from the wafer when the thickness of the organic layer is larger than 1 um. However, in order to well protect the bumps and similar electronic devices, the organic layer is usually required to have a thickness larger than 10 um. Therefore, the organic layer cannot be well adhered to the wafer to keep the bumps from being damaged. Besides, when the grinding film is removed, the organic layer is usually removed off with the grinding film so that the organic layer cannot be regarded as a protection layer when the wafer is diced.

As disclosed in US Publications 2002/0166625, there is disclosed another backside grinding method by using a grinding film with a base and a thicker adhesive layer provided therein. Therein, the thicker adhesive layer is made of a material, such as acrylic adhesive and ultraviolet film (UV film) so as to cover ten to sixty percents of bumps area. However, the interfaces between the bumps and the wafer are not well protected so that the interfaces are easily damaged. Besides, when the grinding film is removed from the wafer, the bumps are easily to be damaged so as to have some bumps fell off from the wafer.

Therefore, providing another method to solve the mentioned-above disadvantages is the most important task in this invention.

SUMMARY OF THE INVENTION

In view of the above-mentioned problems, an objective of this invention is to provide a method of backside grinding a bumped wafer by utilizing the steps of forming a hot-melt adhesive layer (HMA layer) on an active surface of the bumped wafer so as to cover the bumps. Therefore, the bumps can be well protected. Besides, a grinding film is provided and then attached to the hot-melt adhesive layer for proceeding the step of grinding the back surface of the wafer. Furthermore, after the back surface is ground and the grinding film is removed, the hot-melt adhesive layer is still disposed on the active surface of the wafer to enhance the reliability of the step of dicing the wafer into a plurality of chips. Besides, when the back surface of the wafer is ground, the hot-melt adhesive layer is disposed on the active surface of the wafer, so the bumps formed on the wafer are well protected. To be noted, the method is also applicable to a wafer having a plurality of electronic devices formed thereon and protruded from the active surface of the wafer, such as passive components, metal posts, wires and solder balls, so as to well protect the electronic devices at the duration of processing the steps of grinding back surface of the wafer.

To achieve these and other advantages and in accordance with the purpose of the invention, as embodied and broadly described herein, the invention specifically provides a method of providing a bumped wafer having an active surface with a plurality of bumps or electronic devices formed thereon and a back surface; forming a hot-melt adhesive layer on the active surface, wherein the hot-melt adhesive layer covers at least sixty percents of the area of each bump; applying a grinding film onto the hot-melt adhesive layer; grinding the back surface of the wafer; removing the grinding film and keeping the hot-melt adhesive layer remained on the active surface of the wafer for protecting the bumps or electronic devices when the step of grinding the back surface of the wafer is performed; dicing the wafer into a plurality of chips; and removing the hot-melt adhesive layer out of the wafer to have the bumps exposed.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein:

FIGS. 2A to 2I are partially enlarged cross-sectional views showing the progression of backside grinding a bumped wafer according to the preferred embodiment of this invention;

DETAILED DESCRIPTION OF THE INVENTION

Figure 1:
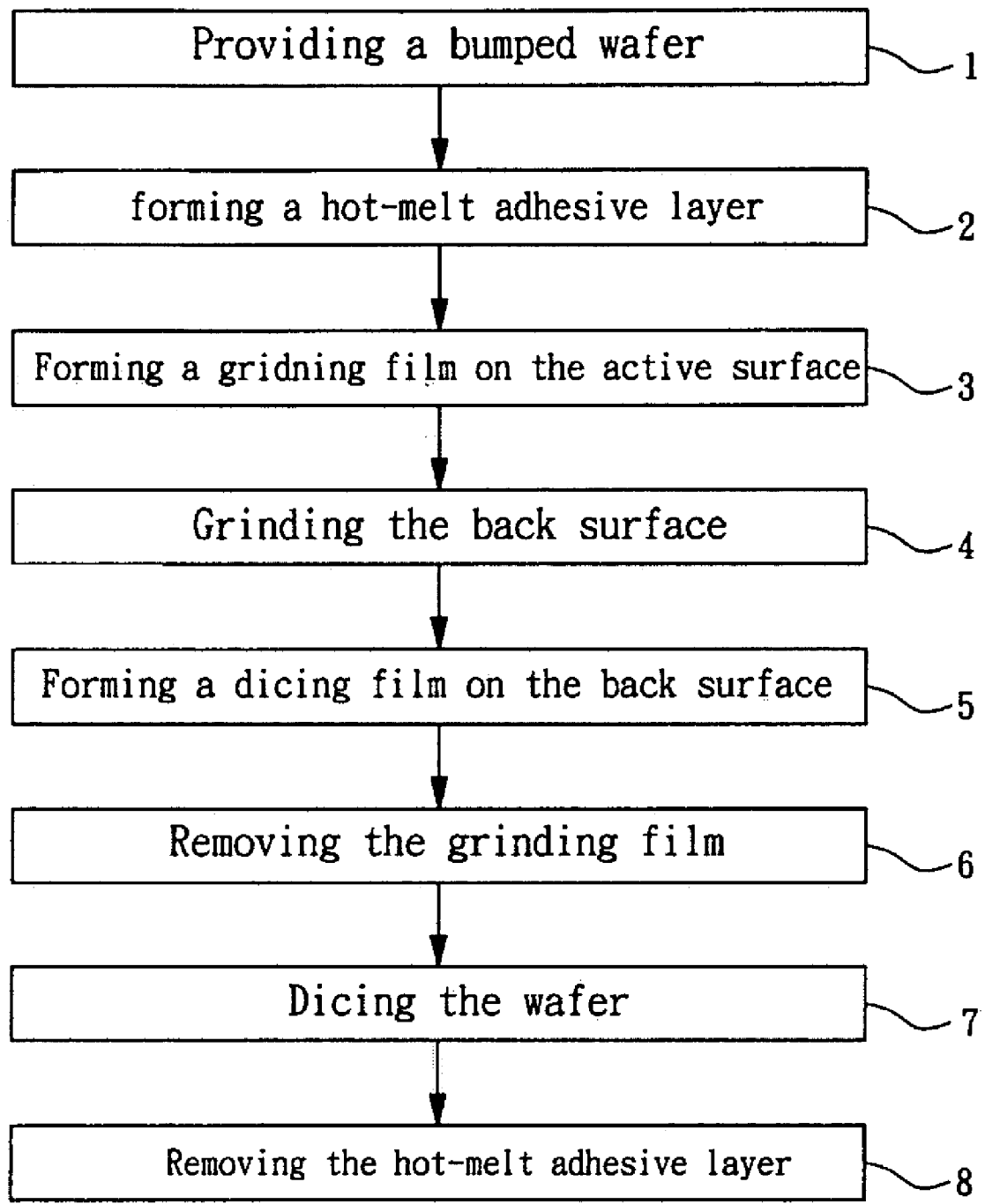
FIG. 1 is a flow chart illustrating the process flow of a method of backside grinding a bumped wafer according to the preferred embodiment of this invention.

The forming method thereof according to the preferred embodiment of this invention will be described herein below with reference to the accompanying drawings, wherein the same reference numbers are used in the drawings and the description to refer to the same or like parts.

As shown in FIG. 1, it illustrates a process flow of a method of backside grinding a bumped wafer. The method mainly comprises the following steps of providing a bumped wafer as shown in step 1, forming a hot-melt adhesive layer on the active surface of the wafer as shown in step 2, providing a grinding film on the hot-melt adhesive layer as shown in step 3, grinding a back surface of the bumped wafer as shown in step 4, attaching a dicing film on the back surface of the wafer as shown in step 5, removing the grinding film form the wafer as shown in step 6, dicing the bumped wafer as shown in step 7 and removing the hot-melt adhesive layer as shown in step 8.

Figure 2C:
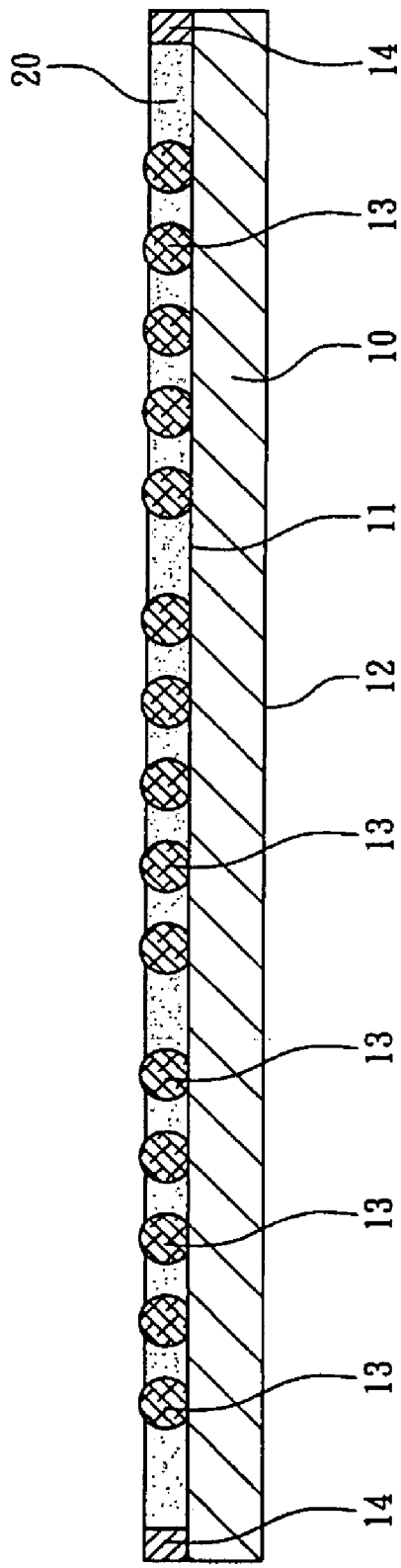

Referring to FIG. 1 again with FIGS. 2B and 2C, the step 2 of forming a hot-melt adhesive layer 20 on the active surface 11 of the bumped wafer 10 comprises attaching the hot-melt adhesive layer 20 on the active surface 11 and performing a heating process, wherein the hot-melt adhesive layer 20 is made of a thermoplastic material. Referring to FIG. 2C again, a heating process is performed at a temperature equal to or higher than the melting point of the hot-melt adhesive layer so as to have the hot-melt adhesive layer 20 enclosed the bumps 13, wherein the meting point of the hot-melt adhesive layer is about 80° C. and the hot-melt adhesive layer covers at least sixty percents of the area of each bump. Preferably, the hot-melt adhesive layer 20 covers at least eighty percents of the area of each bump. After the temperature returns to room temperature, the hot-melt adhesive layer is securely attached to the bumps 13. To be noted, the dam 14 located at the periphery of the active surface 11 of the wafer 10 can block the hot-melt adhesive layer to flow out at the duration of performing heating process. Usually, the height of the dam 14 can vary according to the design of the thickness of the hot-melt adhesive layer 20. Besides, the hot-melt adhesive layer 20 is made of a material with elasticity and transparency so as to provide the identification for dicing wafer and the protection for bumps.

Figure 2D:
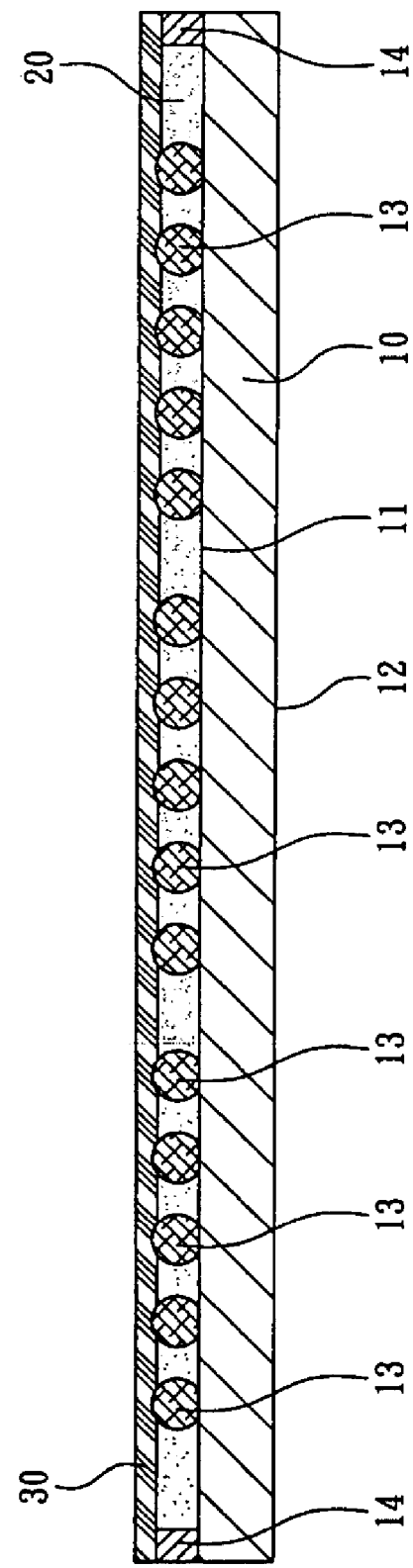

Afterwards, referring to FIGS. 1 and 2D, as shown in the step 3 of providing a grinding film 30 on the active surface 11 of the wafer 10, wherein the grinding film 30, with a base layer and an adhesive layer, such as ultrasonic violet film or similar film made of a material without adhesion under heating process or ultraviolet radiation by ultraviolet light at a temperature lower than 80° C., is attached on the active surface 11 of the wafer 10.

Figure 2E:
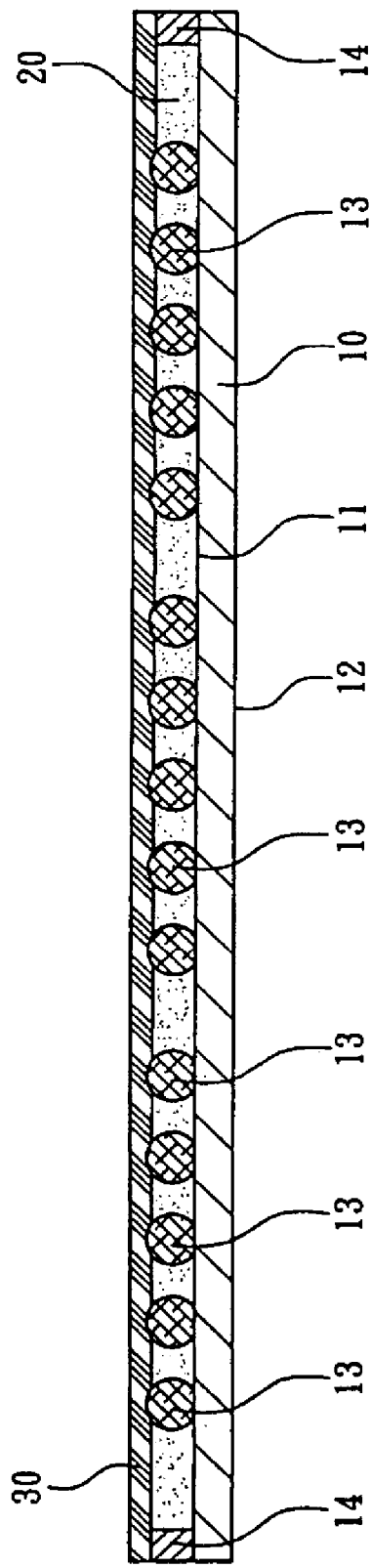

Then, referring to FIGS. 1 and 2E again, the back surface 12 of the wafer 10 is ground so as to have the wafer 10 thinned as shown in the step 4. The active surface 11 of the wafer 10 is covered by the hot-melt adhesive layer 20 and the bumps 13 are also enclosed by the hot-melt adhesive layer 20 so that the hot-melt adhesive layer 20 is disposed between the wafer 10 and the grinding film 30. Therefore, the interface between the bumps 13 and the wafer 10 are well protected from being damaged.

Figure 2F:
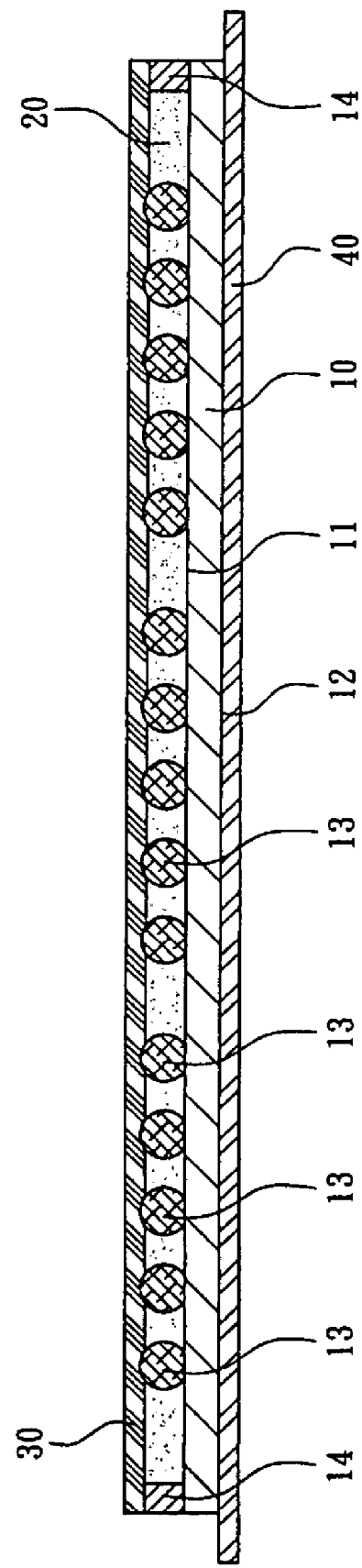

Next, the step 5 of attaching a dicing film 40 on the back surface 12 of the wafer 10 and the step 6 of removing the grinding film 40 are preformed. To be noted, the step 5 can be performed after or before the step 6 is performed. In this embodiment, after the step 4 is performed, the thickness of the wafer 10 is smaller than 6 mils. Therefore, in order to prevent the wafer 10 from being warped, the step 5 is performed to solve this disadvantage. Referring to FIG. 2F and the step 5 as shown in FIG. 1, a dicing film 40 is attached to the back surface 12 of the wafer 10 and then a heating process or ultraviolet radiation by ultraviolet light at a temperature lower than 80° C. is performed to reduce the adhesion of the grinding film 30 to the hot-melt film so as to have the grinding film 30 removed. Because the hot-melt adhesive layer 20 encloses the bumps 13 and covers the active surface 11 of the wafer 10, the bumps 13 are well protected when the step 6 is performed and not removed from the wafer 10 with the grinding film 30.

Next, referring FIG. 2H and the step 7 as shown in FIG. 2H, wherein when the step 7 is performed, the wafer 10 is diced into a plurality of chips 20 disposed at the dicing film 40. Meanwhile, the hot-melt adhesive layer 20 is remained on the active surface 11 of the wafer 10 and the bumps 13 of each chip 15 are still enclosed by the hot-melt adhesive layer 20 so as to prevent the bumps from being damaged and prevent the chip 15 from being contaminated. Preferably, the hot-melt adhesive layer 20 are made of a material with good transparence so as to align the sawing line with the sawing blade through CCD.

Figure 2I:
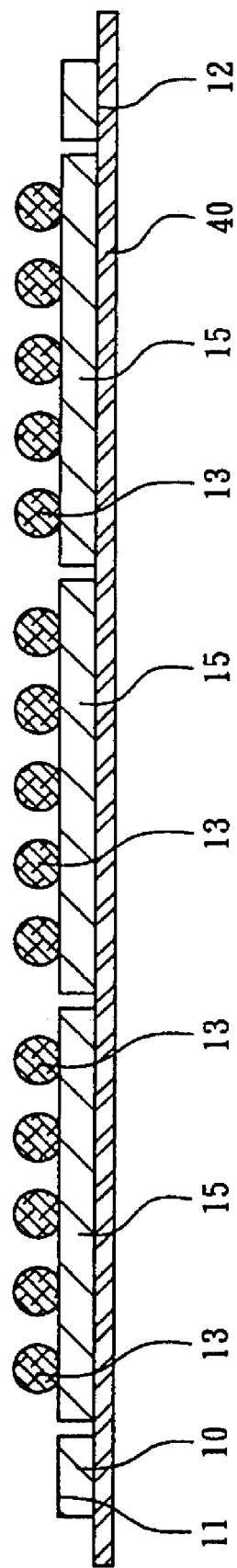

Finally, referring to FIG. 1 and FIG. 2I, wherein the step 8 of removing the hot-melt adhesive layer 20 from the wafer 10 is performed by cleaning the chips 20, regarded as singulated wafer 10, disposed on the dicing film 40 through the DI water (deionize water) and appropriate solution so as to remove the hot-melt adhesive layer 20 out and have the bumps 13 of each chip 20 exposed.

Accordingly, the process of grinding the back surface 12 of the bumped wafer 10 in this invention is performed by attaching the hot-melt adhesive layer 20 onto the active surface 11 of the wafer 10 through heating process so as to have the hot-melt adhesive layer 20 to enclose the bumps 13. Therefore, the bumps 13 can be well protected in the step 4 of grinding the back surface 12 of the wafer 10, the step of removing the dicing film 40 and the step 7 of dicing wafer. Besides, this invention can be applied to the steps of grinding and dicing the wafer 10 with a device formed thereon, wherein the device can be a surface mount device, such as wire-bonding chip, flip-chip, resistor, capacitor and inductance, or the wire, solder ball, metal column and bump, or the combination thereof.

Figure 3:
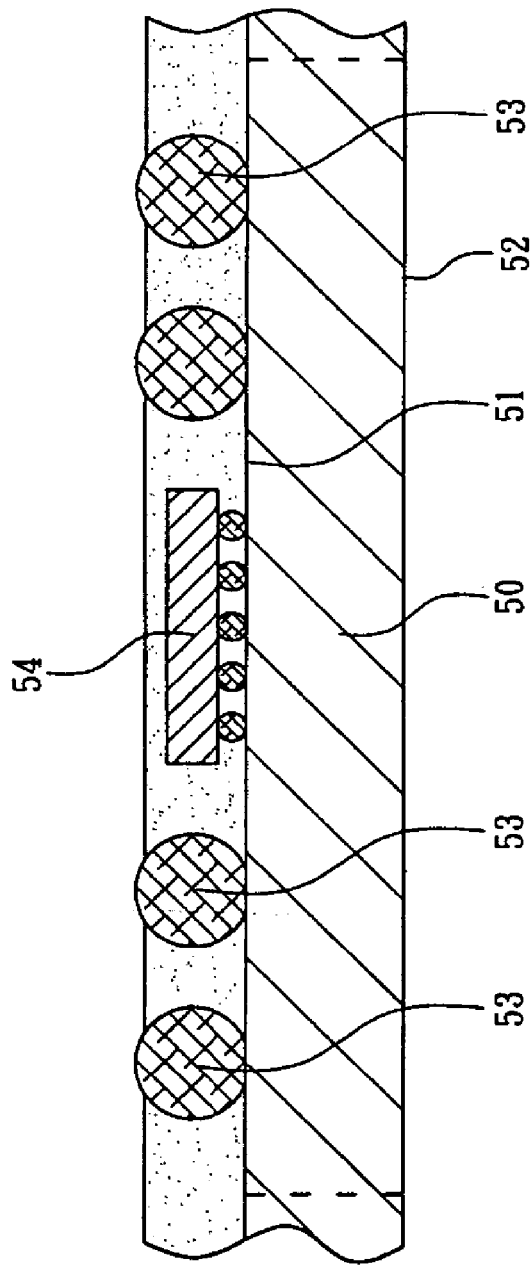
FIG. 3 is a cross-sectional view of a bumped wafer before processing the step of grinding the back surface of the wafer according to another preferred embodiment of this invention.

Referring to FIG. 3 showing the second embodiment of this invention, it illustrates a wafer 50 having a hot-melt adhesive layer 20. Therein, the wafer 50 has an active surface 51 and a back surface 52. The back surface 52 of the wafer 50 has a plurality of bumps 53 and a flip chip 54 formed thereon. The area of having the flip chip 54 thereon is smaller than the area of having the chip 54 thereon defined on the active surface 51 of the wafer 50. For example, a processed wafer has a memory flip-chip 54, and a hot-melt adhesive layer 20 is formed on the active surface 51 of the wafer 50 and attached to the active surface 51 by heating process so as to have the bumps 53 and the bottom thereof covered thereby. The hot-melt adhesive layer 20 has a surface exposed for having a grinding film attached thereto so as to have the bumps well protected by the hot-melt adhesive layer at the duration of processing the steps 4, 6, and 7 for that the hot-melt adhesive layer 20 can be utilized for enhancing the attachment of the bumps 53 to the flip chip 54 and the wafer 50.

Figure 4:
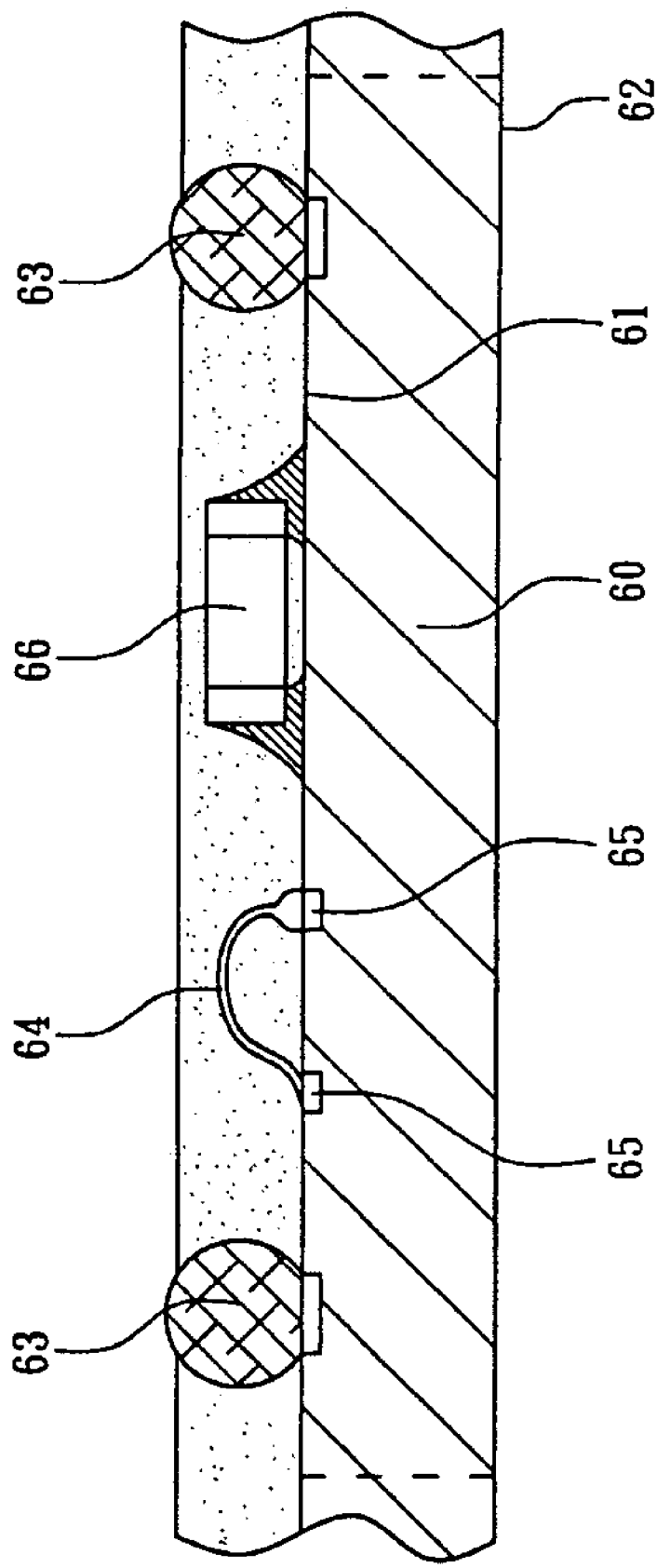
FIG. 4 is a cross-sectional view of a bumped wafer before processing the step of grinding the back surface of the wafer according to another preferred embodiment of this invention.

Referring to FIG. 4 showing the third embodiment of this invention, it illustrates a wafer 60 having a hot-melt adhesive layer 20. Therein, the wafer 60 has an active surface 61 and a back surface 62. The back surface 62 of the wafer 60 has a plurality of bumps 63, a passive component 66 and a wire 64. The wire 64 connects the bonding pads 65 of the wafer. However, the bump 63, the passive component 66 and the wire 64 are protruded from the active surface 61 of the wafer 60 and the hot-melt adhesive layer 20 is attached to the active surface 61 and encloses the bump 63, the passive component 66 and the wire 64 so as to prevent the bump 63, the passive component 66 and the wire 64 from being damaged at the step 4 of grinding the back surface of the wafer, the step 6 of removing the grinding tape.

Although the invention has been described in considerable detail with reference to certain preferred embodiments, it will be appreciated and understood that various changes and modifications may be made without departing from the spirit and scope of the invention as defined in the appended claims.

What is claimed is:

1. A method of backside grinding a bumped wafer, the method comprising:
    providing a bumped wafer, the bumped wafer having an active surface with a plurality of bumps formed thereon and a back surface;
    forming a hot-melt adhesive layer on the active surface and the bumps, wherein the hot-melt adhesive partially covers the bumps;
    forming a first film on the hot-melt adhesive layer;
    forming a second film on the back surface;
    removing the first film;
    singulating the wafer into a plurality of chips, the chips attached on the second film; and
    removing the hot-melt adhesive layer so as to have the bumps exposed.

2. The method of claim 1, wherein the step of forming the hot-melt adhesive layer on the active surface and the bumps is performed at a temperature higher than about 80° C.

3. The method of claim 1, wherein the step of forming the hot-melt adhesive layer on the active surface and the bumps is performed at a temperature equal to about 80° C.

4. The method of claim 1, wherein said the area of each bump covered by the hot-melt adhesive layer is at least larger than sixty percents of the area of said each bump.

5. The method of claim 1, wherein the hot-melt adhesive layer comprises a transparent adhesive.

6. The method of claim 1, wherein the hot-melt adhesive layer comprises an elastic adhesive.

7. The method of claim 1, wherein the active surface further has an electronic device formed thereon.

8. The method of claim 1, wherein the electronic device comprises a passive component.

9. The method of claim 1, further forming a dam at a periphery of the active surface before the step of forming the hot-melt adhesive layer on the active surface.

10. The method of claim 1, wherein the step of removing the first film is performed at a temperature less than a temperature at which the step of forming a hot-melt adhesive layer on the active surface and the bumps is performed.

11. The method of claim 1, wherein the step of removing the first film is performed at a temperature equal to a temperature at which the step of forming a hot-melt adhesive layer on the active surface and the bumps is performed.

12. The method of claim 1, further comprising a step grinding the back surface before the step of forming a second film on the back surface.

13. A method of backside grinding a bumped wafer, the method comprising:
    providing a bumped wafer, the bumped wafer having an active surface with a device formed thereon and a back surface;
    forming a hot-melt adhesive on the active surface and the device, wherein the hot-melt adhesive layer partially covers the device;
    forming a first film on the hot-melt adhesive;
    forming a second film on the back surface;
    removing the first film; and
    removing the hot-melt adhesive layer so as to have the device exposed.

14. The method of claim 13, wherein the step of forming the hot-melt adhesive layer on the active surface is performed at a temperature higher than 80° C.

15. The method of claim 13, further comprising a step grinding the back surface before the step of forming a second film on the back surface.

16. The method of claim 13, wherein the device is entirely covered by the hot-melt adhesive layer.

17. The method of claim 13, wherein the hot-melt adhesive layer comprises a transparent adhesive layer.

18. The method of claim 13, wherein the hot-melt adhesive comprises an elastic adhesive layer.

19. The method of claim 13, wherein the device comprises a surface mount device.

20. The method of claim 13, wherein the device comprises a solder ball.

21. The method of claim 13, wherein the device comprises a metal post.

22. The method of claim 13, wherein the device comprises a wire.

23. The method of claim 13, further forming a dam at a periphery of the active surface before the step of forming the hot-melt adhesive layer on the active surface.

24. The method of claim 13, wherein the step of removing the first film is performed at a temperature less than a temperature at which the step of forming a hot-melt adhesive layer on the active surface and the device is performed.

25. The method of claim 13, wherein the step of removing the first film is performed at a temperature equal to a temperature at which the step of forming a hot-melt adhesive layer on the active surface and the device is performed.

* * * * *